United States Patent [19]
Arabinick

[11] Patent Number: 5,855,805
[45] Date of Patent: Jan. 5, 1999

[54] MICROETCHING AND CLEANING OF PRINTED WIRING BOARDS

[75] Inventor: Nancy D. Arabinick, Bensalem, Pa.

[73] Assignee: FMC Corporation, Philadelphia, Pa.

[21] Appl. No.: 899,033

[22] Filed: Jul. 23, 1997

Related U.S. Application Data

[63] Continuation-in-part of Ser. No. 695,846, Aug. 8, 1996, abandoned.

[51] Int. Cl.$^6$ .............................. C11D 9/04; B44C 1/22; C03C 15/00
[52] U.S. Cl. ........................ 216/106; 252/79.1; 252/79.2; 252/79.4; 510/175
[58] Field of Search .................................. 252/79.1, 79.2; 510/175; 216/106

[56] References Cited

U.S. PATENT DOCUMENTS

| | | |
|---|---|---|
| 3,137,600 | 6/1964 | Margulies et al. . |
| 3,140,203 | 7/1964 | Grunwald ................................ 252/79.2 |
| 3,227,517 | 1/1966 | Leaver et al. . |
| 3,305,135 | 2/1967 | Lindstrom ................................. 134/13 |
| 3,373,114 | 3/1968 | Grunwald . |
| 3,470,044 | 9/1969 | Radimer . |
| 3,887,405 | 6/1975 | Fong et al. .............................. 216/106 |
| 3,988,254 | 10/1976 | Mori ....................................... 252/79.1 |
| 4,507,220 | 3/1985 | Streit et al. ................................. 8/138 |

FOREIGN PATENT DOCUMENTS

| | | | |
|---|---|---|---|
| 0153938 | 2/1982 | Germany .............................. 252/79.2 |
| 58-73776 | 5/1983 | Japan .................................... 252/79.2 |
| 61-435 | 10/1986 | Japan . |
| 805501 | 2/1981 | U.S.S.R. ............................... 252/79.2 |
| 1316030 | 5/1973 | United Kingdom . |

OTHER PUBLICATIONS

Lore, "Cleaning Copper Chemically" 1PC–TP–251 Paper (13 pages), Sep. 17–21, 1978, San Diego, CA.

*Primary Examiner*—Roland Martin
*Attorney, Agent, or Firm*—Patrick C. Baker; Bruce M. Monroe

[57] ABSTRACT

The microetching and cleaning of copper clad substrates in printed wiring board production with solutions containing alkali metal persulfate and sulfuric acid is controlled to provide slower and more consistent copper etch rates by the presence of high proportions of alkali metal sulfate or an alkali metal sulfate/bisulfate mixture in the solutions, in a mole ratio of persulfate to sulfate or sulfate/bisulfate mixture of 1:0.1 to 1:10. When bisulfate is present with the sulfate, the sulfate will comprise at least about 10 mole % of the sulfate/bisulfate mixture. A surfactant may be present in the solutions to aid wettability on the copper clad substrates.

40 Claims, No Drawings

MICROETCHING AND CLEANING OF PRINTED WIRING BOARDS

CROSS-REFERENCE TO RELATED APPLICATIONS

This application is a continuation-in-part of Ser. No. 08/695,846, filed Aug. 8, 1996, now abandoned.

TECHNICAL FIELD

This invention relates to the microetching and cleaning of copper clad substrates during the production of printed wiring boards such as the laminated circuit boards used in a wide variety of electronic devices and electrical appliances. More particularly, the invention relates to compositions and methods for such microetching and cleaning applications.

BACKGROUND ART

The production of modem printed wiring boards ("PWBs") for developing the desired electrically conductive pattern onto plastic substrates clad with copper foil, is a complex process. In the process, electrical interconnections are made by selectively removing unwanted copper foil or adding additional copper to the plastic substrates. The process requires careful removal of excess copper, reagents remaining from the copper deposition, powder, dust, oxides, and other debris or residuals after each construction step. It is not unusual for the process to require 100 or more individual steps because of the complexity of electrical circuitry configurations.

The removal of residual copper is termed "microetching" to emphasize the controlled nature of the action, that is, careful, gentle removal, as contrasted with energetic, bulk removal of copper by use of highly active chemicals, sometimes under extreme conditions of temperature, pH and/or modes of application. The microetching must be combined with cleaning action for efficient and economical processing. Microetching copper is a critical step in manufacturing PWB's because it insures that plating or resist layers will adhere to the substrate each time they are applied. The rate of residual copper removal by application of the microetchant is termed "etch rate".

Alkali metal persulfates such as sodium persulfate (sodium peroxydisulfate) are known to provide a superior copper topography when used as microetchants and cleaners in PWB manufacture. The topography is characterized by a rougher metallurgical surface than results from use of other microetchants, thereby providing a sufficient number of keying sites to ensure good adhesion for plating, resist and lamination. The pH of the persulfate solution can be lowered and surface texture can be varied by the addition of a mineral acid to the solution; phosphoric acid produces a relatively smoother topography whereas sulfuric acid increases roughness. Typically, about 1–2 percent mineral acid by volume of persulfate solution is used. Persulfates also are effective at lower temperatures than other microetchants. For example, persulfates are effective at about 75°–90° F. whereas hydrogen peroxide/sulfuric acid solutions require temperatures of about 115°–130° F.

Despite such advantages, persulfate microetchants tend to decompose rapidly in the presence of copper and exhibit irregular etch rates. This requires frequent microetchant/cleaner bath monitoring and adjustment of oxidizer concentration, particularly as the persulfate nears depletion. To some extent the etch rate can be controlled by adjusting the bath temperature and/or speed of the conveyor transporting PWBs or precursor copper clad substrates through the bath. However, the inevitable consequences are substantial amounts of waste product due to irregular microetching/cleaning and the formation of undesirable copper surfaces. In addition, copper solubilized in the bath must be removed to avoid precipitation of copper sulfate. Although most of the copper may be reclaimed from the baths by electrowinning procedures in order to satisfy environmental regulations, such procedures are time consuming and costly.

Further, because of the difficulty of controlling etch rate when using persulfates, it is routine to prepare, apply and dispose of microetchant/cleaner baths in batch mode. For efficiency of operation and reasonable cost, including reduction of downtime for cleaning and/or replenishing baths, PWB fabricators wish to replace such batch operations with continuous processing, including systems for continuously delivering reagents to the microetchant/cleaner baths and for regulating strength and other bath conditions relative to etch rate.

Japanese patent 86/435 to Komatsu et al and assigned to Mitsubishi Gas Chemicals KK, granted Aug. 1, 1986 on application 81/173606 (filed Oct. 29, 1981 and published May 4, 1983), discloses the addition of sulfuric acid and/or bisulfate ions to sodium or potasssium persulfate solutions for use in pre-etching ("soft" etching) during the production of printed circuit boards, in place of ammonium persulfate or sodium/potassium persulfate alone. Sulfate ion can be supplied by sulfates as well as by sulfuric acid. The mole ratios and concentrations of reagents in the solutions are such as to equal or exceed the copper dissolution rate (etch rate) as compared with that achieved with ammonium persulfate. It has been observed that the compositions of the patent do not provide sufficient control of etch rate.

U.S. Pat. No. 3,373,114 to Grunwald and assigned to MacDermid Inc. discloses dry compositions for desmutting aluminum and aluminum alloys in preparation for subsequent metal finishing operations. The compositions comprise mixtures of sodium, potassium or ammonium persulfate and a soluble acid salt of an acid selected from acid salts of sodium, potassium and ammonium acid salts of sulfuric acid, in a mole ratio of 1:1 to 10:1. A typical composition is a dry mixture of ammonium persulfate and sodium bisulfate. Baths prepared from the dry mixtures must have a pH not exceeding 2.0 for success in desmutting aluminum. It has been determined that such compositions are not useful in the microetching and cleaning of copper clad PWB substrates because the high acidity and hygroscopic nature of the bisulfate renders the compositions unstable and diminishes etch rate control.

DISCLOSURE OF THE INVENTION

It has now been discovered, unexpectedly, that the aforementioned deficiencies of alkali metal persulfate microetchants and cleaners can be overcome by admixing, in predetermined amounts, the persulfate with an alkali metal sulfate, or mixture of alkali metal sulfate and a certain amount of alkali metal bisulfate, to form a dry mixture. The dry mixture is then dissolved in an aqueous medium and sulfuric acid is added in a predetermined amount to form a solution for application to copper clad substrates in PWB fabrication.

It has been determined that although the compositions of the invention exhibit lower etch rates than those of the prior art, the compositions have improved stability and provide more consistent and predictable etch rates. These properties permit greater control of the microetching and cleaning steps in PWB fabrication, thereby yielding the desired copper surface, increasing the efficiency of the process, reducing cost and production of scrap boards, satisfying environmental and safety concerns, and providing a basis for continuous processing.

Accordingly, in one aspect the invention is a composition for microetching and cleaning copper clad substrates in the production of PWBs, which composition comprises a dry mixture of (a) an alkali metal persulfate and (b) a metal salt selected from alkali metal sulfate and a mixture of alkali metal sulfate and alkali metal bisulfate, wherein the mole ratio of (a) to (b) is in the range 1:0.1 to 1:10 and the amount of alkali metal sulfate in the mixture (b) is at least about 10 mole % thereof.

Preferred alkali metals for both the persulfates (peroxydisulfates) and the alkali metal sulfates are sodium and potassium, sodium being more preferred. A preferred mole ratio of (a) persulfate to (b)alkali metal sulfate/bisulfate component is in the range 1:0.1 to 1:5, most preferably the range is 1:0.2 to 1:3. As previously stated, if alkali metal bisulfate is used in component (b), it is present only in admixture with at least about 10 mole % alkali metal sulfate, preferably at least about 30 mole %, more preferably at least about 50 mole %. Higher amounts of alkali metal bisulfate render the powder too hygroscopic and acidic for long term storage due to caking and potential instability.

Optionally, the dry mixture may contain (c) a water soluble metal salt different from metal salt component (b), selected from a metal sulfate, a metal bisulfate and a mixture thereof, wherein the mole ratio of (a) to (c) is in the range 1:0.001 to 1:1. If metal salt (c) is copper sulfate or copper bisulfate, the copper may be introduced as elemental copper in the dry mixture or may be added as such to the bath. The copper then will react with sulfate or bisulfate to form the salt.

In a second aspect, the invention comprises an aqueous solution containing, in concentrations effective for the microetching and cleaning of copper clad substrates in the fabrication of PWBs, (a) alkali metal persulfate, (b) a metal salt component selected from alkali metal sulfate, alkali metal bisulfate and a mixture of alkali metal sulfate and alkali metal bisulfate, and (d) sulfuric acid, wherein the a:b:d mole ratio is in the range 1:0.3:0.2 to 1:10:3 and the amount of alkali metal sulfate in the mixture (b) is at least about 10 mole %.

The solution optionally may contain (c) a water soluble metal salt different from metal salt component (b), selected from a metal sulfate, a metal bisulfate and a mixture thereof, wherein the mole ratio of (a) to (c) is in the range 1:0.001 to 1:1.

In a third aspect, the invention includes a method for preparing a solution useful for the microetching and cleaning of copper clad substrates in PWB fabrication, the method comprising forming an aqueous solution of the dry mixture of the invention described above to contain (a) an alkali metal persulfate and (b) a metal salt component selected from alkali metal sulfate and a mixture of alkali metal sulfate and alkali metal bisulfate, and (d) sulfuric acid, to provided concentrations of (a), (b) and (d) in the ranges 0.1–2.0M, 0.3–4.0M and 0.2–1.0M, respectively.

Optionally, the method may include adding to the aqueous medium prior to, simultaneously with or after addition of components (a), (b) and (d), a water soluble metal salt different from metal salt component (b), selected from a metal sulfate, metal bisulfate or mixture thereof, to provide a concentration of (c) in the range 0.001 to 0.3M.

In a fourth aspect, the invention comprises a method for the microetching and cleaning of copper clad substrates in the production of PWBs, which comprises contacting the substrates with the solution of the invention described above, and removing the solution together with undesired residues.

The compositions of the invention in dry form are prepared by admixing (a) crystalline alkaline metal persulfate with (b) crystalline alkali metal salt or mixture of alkali metal salt and alkali metal bisulfate in the proportions designated above, using any suitable mixing means. The resultant product is a powder; when dissolved in water to form a saturated solution, the pH thereof will depend on the amount of bisulfate, if any, present in the powder. When zero or low amounts of bisulfate are present, the pH may be above 2. Higher bisulfate lowers the pH. The powder may be packaged, stored and transported to PWB fabrication sites. At such sites the powder is dissolved in water and sulfuric acid added in amounts predetermined to provide the concentrations set forth above. Concentrated (95–99 wt %, preferably 98 wt %) sulfuric acid is preferred but lower concentrations can be used provided the requisite molarity is obtained.

Alternatively, the microetchant/cleaning solutions of the invention can be prepared at a PWB fabrication site from the individual components or a concentrate solution can be prepared off-site by a supplier, shipped to the PWB fabrication site and diluted to provide the requisite concentrations of active ingredients. Normally, to avoid the formation of detonable caroate compositions, sulfuric acid will not be present in the concentrates but will be added to a bath of the other components at the PWB fabrication site.

Concentrations of (a) persulfate, (b) alkali metal sulfate/alkali metal bisulfate and (d) sulfuric acid in the microetchant and cleaning solution should be within the ranges set forth above. Preferred ranges are 0.1–2.0M, 0.3–4.0M and 0.2–1.0M, respectively. The most preferred ranges are 0.25–1.0M, 0.3–2.0M and 0.2–0.4M, respectively.

Optionally, a water soluble metal salt (c) different from component (b) may be present in the dry powder or added to a concentrate or to the final solution formed from persulfate (a) and sulfate/bisulfate component (b). The metal salt (c) is selected for ability to activate or promote oxidative functionality of the persulfate (a) and, in some cases, to stabilize the microetchant solution. Generally, suitable metal salts (c) are any non-toxic, non-corrosive, water soluble salts of metals from any Periodic Group (Chemical Abstracts Service Table) other than Group 1A. Representative metals are those of Groups 2A (except Be and Ra), 3A (except B and Tl), 4A (Sn only), 1B, 2B (except Hg), 3B, 4B (except Zr) and 8 (except Ni and Rh). Preferred metal salts (c) are the sulfates of copper, magnesium, calcium, barium, silver, zinc, cadmium, tin, aluminum, gallium, indium, palladium, cobalt, iron, vanadium, scandium, yttrium, lanthanum, hafnium and strontium. Other anions may be used to the extent the metals are sufficiently solubilized thereby. Copper sulfate or a hydrate thereof, such as the pentahydrate, is the most preferred metal salt (c).

When it is desired to add metal salt (c) to the dry mixture of persulfate (a) and alkali sulfate/bisulfate component (b), it will be incorporated in the mole ratio set forth above. A preferred mole ratio of (a) to (b) to (c) is 1:0.1:0.001 to 1:10:0.3. A useful concentration of metal salt (c) in the microetchant and cleaning solution is in the range 0.001–0.1M. A preferred range is 0.001 to 0.05M and the more preferred range is 0.001 to 0.01M.

Optionally, in all aspects of the invention one or more surfactants (e) may be present to aid wettability of the microetchant and cleaning solution on the copper clad substrate, and detergency. The surfactant may be incorporated into the dry mixture of components (a) and (b) but more usually will be added to the treating solution formed from the dry mixture.

The copper clad substrates treated in accordance with the invention are any plies of plastic, fiber glass or other material to which copper foil is adhered or upon which copper is deposited, electrolessly or electrolytically. The substrates can be single or multiple plies in the form of composite or layered structures such as laminates and other materials. Such copper clad substrates and laminates are conventional in the PWB art. The substrates may contain through-holes on the walls of which copper has been deposited for electrical connection. Single laminates or multilayer boards must be microetched and cleaned, usually numerous times during PWB fabrication. Application of the microetchant and cleaning solution is usually by spraying or immersion of copper clad substrates in a bath formed with the solution of this invention but the solution can be applied in any other convenient manner.

Practice of the invention generally utilizes procedures commonly employed with acidic persulfate solutions. To clean the copper-clad laminates, the plastic substrates are immersed or sprayed with the microetching solution for about 30–180 seconds. An effective temperature of the solution is about 75°–95° F. However, since etch rates are a function of the temperature and concentration of persulfate in the microetching solution, the conditions can be varied depending on the etch rates desired and concentrations of reagents. For example, it has been observed that a 0.51M sodium persulfate solution containing various quantities of sodium sulfate or sodium sulfate/bisulfates yield etch rates of about 38–48 microinches/min at 85° F. The invention is particularly effective when the solution contains a metal salt (c), e.g., copper sulfate, in an amount up to about 0.3M. The lower etch rates observed with the invention compared to persulfate solutions are advantageous due to the trend of fabricating PWBs with thinner layers of copper on the laminates.

While not fully understood, it is believed that the alkali metal sulfate/bisulfate component (b) of the invention may buffer, retard or damp the oxidative activity of the persulfate in a manner dependent on concentration and acidity. Also, the higher concentration of sulfate ion than in prior art compositions may promote reaction with the solubilized copper removed during the operation and present in the bath as copper sulfate. The higher concentration of sulfate may form a protective layer on the copper foil, thus impeding catalytic action of the copper on the persulfate. The practical effect of these mechanisms is slowing of the copper etch rate in a controlled manner with the resultant benefits of longer bath life, lower temperature and reproducibility.

SURFACTANTS

The detergency of the microetchant and cleaning solutions of the invention, and wettability of the solutions for copper clad PWBs, can be improved by adding to the solutions one or more surfactants (e). A wide variety of surfactants are available for this purpose. Candidates are selected by screening for solubility in the treating solution, ability to improve wetting, and stability in the presence of persulfate and under the acidic conditions of the solutions (typically, pH of about 0–3). Solubility should be essentially complete in order to avoid contaminating the copper clad substrate. Selection of nonionc surfactants may also be based on Hydrophile-Lipophile Balance ("HLB") in accordance with well known principles. Generally, an HLB of about 7–15 (on a scale of 1–18) will be satisfactory for wettability, preferably about 13–15 for best detergency along with wettability. Biodegradability of the surfactant is also a useful property, although not critical in every application.

Surfactants useful in accordance with the above criteria of solubility, wettability and stability include nonionic, anionic, cationic and amphoteric surfactants. The preferred classes to date are the nonionics and cationics. Useful nonionics include fatty alcohol ethoxylates, alkyl phenol ethoxylates, fatty acid esters, fatty acid alkanolamides, and the like. Anionics include the primary and secondary alkyl sulphates derived from sulphation of C12–C18 and C8–C18 olefins, respectively; branched and linear alkylbenzene sulphonates; petroleum sulphonates, naphthenates and alkyl napththalene sulfphonates; phosphate esters; salicylates; sulphonated esters; various paraffin and olefin sulphonates; sulphosuccinates such as mono and di-alkyl sulphosuccinates; secondary alkane sulphonates; alcohol ether sulphates; alkylphenol ether sulfates; ethoxycarboxylates; and the like.

Cationic surfactants include compounds containing protonated amino or quaternized ammonium groups derived from N-heterocycles such as imidazoline, morpholine or pyridine containing a linear or branched, saturated or unsaturated, hydrocarbon group, optionally containing or in the form of amido, ester, ether or amino groups, and the like. Representative cationics are mono, di and trialkyl amines wherein alkyl is linear or branched, and/or unsaturated, depending on the base oil from which the amine is derived. The mono and di- amines may also be alkoxylated to alkoxylated tertiary amines, and the latter alkylated to quaternary salt form. Generally, the water solubility of aliphatic amines is improved by reaction with mineral acids or low molecular weight carboxylic acids to produce acid salts. Amphoterics include alkylamino acids, alkylbetaines and alkylsulphobetaines prepared by cyanoethylation, carboxymethylation or similar reactions with alkylamines, and the like.

The surfactant concentration in end use solutions may range from about 0.001 to about 5% by weight, preferably about 0.1 to about 1% by weight. Normally, the surfactant will be added to the etchant/cleaning solution at the PWB fabrication site. However, the surfactant can be added to concentrates of the solution for later dilution. In such event, the surfactant will be added in such amounts as will provide the end use concentration described, upon dilution. The surfactant may also be incorporated into the dry powder embodiment of the invention, by suitable spray drying or other processing techniques.

Example 5 and Table 5 below describe contact angle measurements on a variety of surfactants in solutions of the invention, as a preliminary basis for determining wettability and therefore suitability of the surfactants in the solutions.

The following examples further illustrate the invention but are not intended to limit the scope thereof. Throughout this specfication and the claims, all parts and percentages are by weight and "copper" means ionic copper unless otherwise indicated. "M" means molarity (moles per liter).

EXAMPLE 1

A. A Test Procedure and Results

This example illustrates the effect of sulfate and bisulfate ions on copper etch rates.

Into a 400 mL vessel was placed 54 g of sodium persulfate, 38.36 g sodium sulfate and 27.57 g sodium bisulfate. The solids were admixed and 300 mL deionized water at approximately 90° F. was added to the vessel. The vessel was equipped with a magnetic stir bar, placed on a hot plate/stirrer, and stirred to form a microetching solution. Upon complete dissolution of the solids, 4.5 mL concentrated sulfuric acid (98%) was added. The concentrations of persulfate, sulfate, bisulfate and sulfuric were 0.76M, 0.90M, 0.76M and 0.29M, respectively. The solution temperature was maintained at 85°±2° F. for the duration of the procedure. Initial pH, temperature, persulfate concentration and active oxygen were determined and recorded.

Into the microetching solution at 85° F. was immersed an approximately 1×3 in single-sided, 1 oz copper-clad (electrolytic copper) FR-4 (epoxy/glass fabric) laminate board. The time for the initial removal of the copper (by appearance of the green laminate beneath the copper layer) was recorded as well as the complete copper removal time. Upon removal of the board from solution, the pH, temperature, persulfate concentration and active oxygen were determined and recorded.

A second laminate board was immersed in the same microetching solution at 85° F. and the recording of test data was repeated. Prior to the immersion of a third board, 1.11 g copper foil was added to raise the copper concentration to 1 oz/gal. The board was immersed and the test data recording was repeated. A fourth board was immersed and the test data recording was repeated. Prior to immersion of a fifth board, 1.07 g copper foil was added to raise the copper concentration in solution to 2 oz/gal (0.24M). The test data recording was repeated.

Copper etch rates were calculated using the following equation:

$$\text{Etch rate } (x\ 10^{-6}\ \text{in/min}) = \frac{1400}{(t_i + t_c)/2}$$

where:

1400=thickness of 1 oz copper per square foot on copper-clad laminate×10$^{-6}$ in $t_i$=time required for initial breakthrough of laminate $t_c$=time required for the complete removal of copper The test results of part A are set forth in Table 1A. It will be seen that the etch rate remained relatively constant.

TABLE 1A

| Board | Copper Etch Rate (× 10$^{-6}$ in/min) | Copper Concentration (M) |
|---|---|---|
| 1 | 44.1 | 0.036 |
| 2 | 44.2 | 0.059 |
| 3 | 46.8 | 0.137 |
| 4 | 43.7 | 0.179 |
| 5 | 41.1 | 0.254 |

B. Prior Art Comparison

A microetching solution as currently used in PWB fab shops was prepared and tested on five boards. The test procedure was the same as in Part A above except the test solution comprised 54 g sodium persulfate dissolved in 300 mL deionized water and 4.5 mL concentrated sulfuric acid (98%). The concentration of persulfate and sulfuric acid were 0.76M and 0.29M, respectively. Prior to the immersion of the third board, 1.161 g copper foil was added to raise the copper concentration to 1 oz/gal (0.12M). The board was immersed and the test procedure of part A was repeated. A fourth board was immersed and the test procedure was repeated. Prior to the immersion of a fifth board, 0.92 g copper foil was added to raise the copper concentration in solution to 2 oz/gal (0.24M). The test procedure was repeated. Copper etch rates were calculated as described above to give the results set forth in Table 1B. It will be seen that the conventional solution provided high but widely variable etch rates as compared with those of Ex. 1A. The addition of significant quantities of copper foil (approximately 1 g) to the solution of Ex. 1A had little effect upon the copper etch rate. This was not true for the persulfate solution of Ex. 1B. Upon the addition of approximately 1 g of copper foil to the solution before board 3, the copper etch rate increased to 90 microinches/minute.

TABLE 1B

| Board | Copper Etch Rate (× 10$^{-6}$ in/min) | Copper Concentration (M) |
|---|---|---|
| 1 | 76.5 | 0.026 |
| 2 | 82.6 | 0.057 |
| 3 | 90.0 | 0.163 |
| 4 | 74.2 | 0.186 |
| 5 | 71.6 | 0.268 |

EXAMPLE 2

A. Test Procedure and Results

The test procedure of Example 1A was repeated but the solution contained a lower concentration of sodium persulfate and no sodium bisulfate. The solution was prepared from 36.45 g sodium persulfate (0.51M) and 12.30 g sodium sulfate (0.29M). The solids were admixed, dissolved in deionized water, and 4.5 mL of concentrated sulfuric acid (98% 0.29M) added. The resulting microetching solution was tested at 85° F. on five boards as described in Ex. 1A above. Prior to the immersion of the third board, 1.10 g copper foil was added to raise the copper concentration to 1 oz/gal. The board was immersed and the test procedure was repeated. A fourth board was immersed and the test procedure repeated. Prior to immersion of the fifth board, 1.02 g copper foil was added to raise the copper concentration in solution to 2 oz/gal (0.24M). The described test procedure was repeated and copper etch rates calculated as in Ex. 1A. Test results are set forth in Table 2A from which it will be noted that etch rates were relatively constant.

TABLE 2A

| Board | Copper Etch Rate (× 10$^{-6}$ in/min) | Copper Concentration (M) |
|---|---|---|
| 1 | 46.5 | 0.032 |
| 2 | 44.1 | 0.060 |
| 3 | 48.5 | 0.150 |
| 4 | 47.2 | 0.182 |
| 5 | 38.8 | 0.272 |

B. Prior Art Comparison

A microetching solution as currently used in PWB fab shops was prepared, tested and the results compared with those of Ex. 2A. The test procedure was the same as in Ex. 1A above except 36.45 g sodium persulfate was dissolved in 300 mL of deionized water and 4.5 mL concentrated sulfuric acid (98%) to provide concentrations of 0.51M and 0.29M, respectively. Prior to the immersion of the third board, 1.09 g copper foil was added to raise the copper concentration to 1 oz/gal. The board was immersed and the test procedure repeated. A fourth board was immersed and the test procedure repeated. Prior to immersion of a fifth board, 1.11 g copper foil was added to raise the copper concentration in solution to 2 oz/gal (0.24M). The test procedure was repeated and copper etch rates calculated. Test results are set forth in Table 2B below from which again it will be seen that although etch rates are high, they are widely variable as compared with those of Ex. 2B. Example 2B further illustrates the susceptibility of persulfate to copper-catalyzed persulfate decomposition. As the copper concentration increased, the copper etch rates decreased.

TABLE 2B

| Board | Copper Etch Rate ($\times 10^{-6}$ in/min) | Copper Concentration (M) |
|---|---|---|
| 1 | 64.4 | 0.032 |
| 2 | 61.9 | 0.060 |
| 3 | 59.6 | 0.152 |
| 4 | 58.0 | 0.177 |
| 5 | 49.3 | 0.272 |

EXAMPLE 3

A. Test Procedure and Results

The test procedure as described in Example 1A was repeated on five PWBs but using a solution containing higher concentrations of sodium persulfate and sodium sulfate. The solution was prepared from 54.0 g sodium persulfate (0.76M) and 65.9 g sodium sulfate (1.55M). The solids were admixed, dissolved in deionized water, and 4.5 mL concentrated sulfuric acid (98%) added. The resulting microetching solution was tested as described in Ex. 1A. Prior to immersion of the third board, 1.15 g copper foil was added to raise the copper concentration to 1 oz/gal. The board was immersed and the test procedure repeated. A fourth board was immersed and the test procedure repeated. Prior to immersion of the fifth board, 1.01 g copper foil was added to raise the copper concentration in solution to 2 oz/gal (0.24M). The test procedure was repeated and copper etch rates calculated. The results are set forth in Table 3A below from which it will be seen that the etch rates are relatively constant. The higher concentration of sulfate ions present in this example illustrates the influence of sulfate upon ensuring predictable copper etch rates over a range of copper concentrations.

TABLE 3A

| Board | Copper Etch Rate ($\times 10^{-6}$ in/min) | Copper Concentration (M) |
|---|---|---|
| 1 | 40.7 | 0.028 |
| 2 | 40.0 | 0.057 |
| 3 | 39.6 | 0.152 |
| 4 | 40.3 | 0.183 |
| 5 | 38.4 | 0.277 |

B. Prior Art Comparison

A microetching solution as currently used in PWB fab shops was prepared, tested on five PWBs and the results compared with those of Ex. 3A. The same experimental procedure was used but the solution contained 54 g sodium persulfate (0.76M) dissolved in 300 mL deionized water and 4.5 mL of concentrated sulfuric acid (98%, 0.29M). Prior to immersion of the third board, 1.16 g copper foil was added to raise the copper concentration to 1 oz/gal. The board was immersed and the test procedure repeated. A fourth board was immersed and the test procedure repeated. Prior to immersion of the fifth board, 0.92 g copper foil was added to raise the copper concentration in solution to 2 oz/gal (0.24M). The test procedure was repeated. Copper etch rates were calculated. The test results are set forth in Table 3B from which it will be seen that the etch rates, while high, vary substantially as compared with those of Ex. 3A.

TABLE 3B

| Board | Copper Etch Rate ($\times 10^{-6}$ in/min) | Copper Concentration (M) |
|---|---|---|
| 1 | 76.5 | 0.026 |
| 2 | 82.7 | 0.057 |
| 3 | 90.0 | 0.163 |
| 4 | 74.2 | 0.186 |
| 5 | 71.7 | 0.268 |

EXAMPLE 4

A. Test Procedure and Results

The test procedure of Ex. 1A was repeated except the solution contained 107.96 g sodium persulfate(0.51M) and 35.95 g sodium sulfate(0.28M). The solids were admixed and 900 mL deionized water at approximately 90° F. was added to the vessel. Upon complete dissolution of the solids, 13.5 mL concentrated sulfuric acid (98%, 0.29M) was added. The test procedure was repeated on a total of 24 boards and copper etch rates were calculated to give the results set forth in Table 4A. It will be seen that the solution more consistently removed copper from the laminate than was the case with the prior art solution of Ex. 4B below. The mean copper etch rate was determined to be 39.3 microinches/minute with a standard deviation of 2.9.

TABLE 4A

| Board | Copper Etch Rate ($\times 10^{-6}$ in/min) | Copper Concentration (M) |
|---|---|---|
| 1 | 37.0 | 0.007 |
| 2 | 36.5 | 0.017 |
| 3 | 39.3 | 0.024 |
| 4 | 37.5 | 0.030 |
| 5 | 41.3 | 0.042 |
| 6 | 39.8 | 0.052 |
| 7 | 45.0 | 0.059 |
| 8 | 39.6 | 0.072 |
| 9 | 42.2 | 0.082 |
| 10 | 39.5 | 0.090 |
| 11 | 45.5 | 0.099 |
| 12 | 40.0 | 0.107 |
| 13 | 39.8 | 0.126 |
| 14 | 40.6 | 0.136 |
| 15 | 39.7 | 0.140 |
| 16 | 42.5 | 0.154 |
| 17 | 39.8 | 0.159 |
| 18 | 39.1 | 0.174 |
| 19 | 38.4 | 0.181 |
| 20 | 38.4 | 0.190 |
| 21 | 37.6 | 0.200 |
| 22 | 35.7 | 0.217 |
| 23 | 33.8 | 0.227 |
| 24 | 33.7 | 0.242 |

B. Prior Art Comparison

A microetching solution as currently used in PWB fab shops was prepared and tested as set forth in Ex. 1A. The solution contained the triple salt of potassium peroxymonosulfate and had essentially the same initial active oxygen content as the solution of Ex. 4A. The solution was prepared by placing 167.2 g of the potassium peroxymonosulfate salt in a 1 liter vessel and dissolving the solids by the addition of 900 mL deionized water at approximately 90° F. The vessel was equipped with a magnetic stir bar, placed in a water bath at 85° F. which rested on top of a hot plate/stirrer, and stirred. Upon complete dissolution of the solids, 13.5 mL concentrated sulfuric acid (98%, 0.29M) was added. Additional boards were immersed in the same microetching solution and the test procedure was repeated. A total of 19 boards was tested. Copper etch rates were calculated. The test results are set forth in Table 4B from which it will be seen that the etch rates are initially extremely high and variable as compared with those of Ex. 4A. In particular, the microetching solution had a high inital etch rate ($105 \times 10^{-6}$ in/min) and quickly lowered to $85 \times 10^{-6}$ in/min. After 0.17M of copper accumulated in the microetching solution, not all of the copper was removed from the twentieth board and the experiment was terminated. The copper carrying capacity of this prior art solution was lower than that of the invention (Ex. 4A). Higher copper carrying capacity increases microetching efficency and control and reduces generation of chemical waste. The potassium peroxymonosulfate solution had a mean copper etch rate of 72.5 microinches/minutes with a standard deviation of 10.9.

TABLE 4B

| Board | Copper Etch Rate ($\times 10^{-6}$ in/min) | Copper Concentration (M) |
| --- | --- | --- |
| 1 | 105.1 | 0.007 |
| 2 | 84.8 | 0.014 |
| 3 | 83.8 | 0.024 |
| 4 | 75.2 | 0.037 |
| 5 | 75.5 | 0.047 |
| 6 | 76.1 | 0.053 |
| 7 | 74.8 | 0.064 |
| 8 | 68.0 | 0.072 |
| 9 | 79.5 | 0.085 |
| 10 | 73.4 | 0.090 |
| 11 | 70.6 | 0.100 |
| 12 | 69.7 | 0.107 |
| 13 | 67.9 | 0.113 |
| 14 | 65.0 | 0.123 |
| 15 | 64.4 | 0.130 |
| 16 | 63.5 | 0.150 |
| 17 | 60.4 | 0.157 |
| 18 | 61.2 | 0.164 |
| 19 | 59.3 | 0.168 |

EXAMPLE 5

The contact angles of various solutions of the invention, with and without surfactant (1.0% by weight), were determined on copper clad laminate using a goniometer. The test results of Table 5 below are averages of triplicate values. Water alone gave an angle of 73. The solutions tested were the following where the sulfuric acid, if present, is concentrated (98 wt %) and its vol %, equivalent to 0.29M, is 1.5:

A: 0.75M sodium persulfate, 0.32M sodium sulfate, 0.29M sulfuric acid

B: 0.50M sodium persulfate, 0.21M sodium sulfate, 0.29M sulfuric acid

C: 0.50M sodium persulfate, 0.21M sodium sulfate

D: 0.25M sodium persulfate, 0.10M sodium sulfate, 0.29M sulfuric acid

TABLE 5

CONTACT ANGLE

| Surfactants | Solutions | | | |
| --- | --- | --- | --- | --- |
|  | A | B | C | D |
| No surfactant | 81 | 74 | 71 | 66 |
| Nonionic surfactant | | | | |
| Tergitol ® TMN-6 | 41 | 35 | 35 | 32 |
| Triton ® X-100 | 39 | 39 | 25 | 23 |
| Neodol ® 23-3 | 33 | 25 | 28 | 25 |
| Neodol ® 25-7 | 27 | 20 | 27 | 26 |
| Trycol ® 5943 | 14 | 13 | 15 | 17 |
| Anionic surfactant | | | | |
| Soprophor 3D-33 | 51 | 45 | 39 | 44 |
| Cationic surfactant | | | | |
| Adogen ® 464 | 48 | 37 | 36 | 36 |

The Triton® X-100 (Union Carbide Corporation) is an alkylphenol ethoxylate. The Tergitol®, Neodol® and Trycol® surfactants are fatty alcohol ethoxylates available from Union Carbide Corporation, Shell Oil Company and Henkel Corporation, respectively. The Trycol® surfactant is described as a POE(12) tridecyl alcohol product. The Neodol® surfactants are biodegradable and are C12–C15 linear primary alcohol ethoxylates. The Soprophor surfactant is a phosphorus organic derivative (Rhone-Poulenc Corporation). The cationic surfactant is a quaternary ammonium compound, available from Aldrich Chemical Company. The test results show that although all of the surfactants lowered the contact angle, and thereby improved the wettability afforded by the solutions, the best performance was achieved with the Trycol®5943.

I claim:

1. A composition for microetching and cleaning copper clad substrates in the production of printed wiring boards, the composition comprising a dry mixture of (a) an alkali metal persulfate and (b) a metal salt component selected from the group consisting of alkali metal sulfates and mixtures of alkali metal sulfates and alkali metal bisulfates, wherein the mole ratio of (a) to (b) is in the range of 1:0.1 to 1:10, and an alkali metal sulfate comprises at least about 10 mole % of metal salt component (b).

2. The composition of claim 1 wherein the mole ratio of (a) to (b) is in the range 1:0.1 to 1:5.

3. The composition of claim 1 wherein the mole ratio of (a) to (b) is in the range 1:0.2 to 1:3.

4. The composition of claim 1 additionally comprising component (c) a water soluble component different from metal salt component (b), said component (c) selected from the group consisting of metal sulfates, metal bisulfates and mixtures thereof, wherein the mole ratio of (a) to (c) is in the range of 1:0.001 to 1:1.

5. The composition of claim 4 wherein metal salt (c) is copper sulfate or a hydrate thereof.

6. The composition of claim 1 wherein the mole ratio of (a) to (b) is in the range 1:0.1 to 1:5 and the composition additionally contains (c) copper sulfate in a mole ratio of (a) to (c) in the range 1:0.001 to 1:1.

7. The composition of any of claims 1–6 and 29–32 wherein the alkali metal of (a) and (b) is sodium, potassium or a combination thereof.

8. The composition of any of claims 1–6 and 29–32 wherein the alkali metal of (a) and (b) is sodium.

9. The composition of any one of claims 1–6 wherein metal salt component (b) comprises sodium sulfate or a mixture of sodium sulfate and sodium bisulfate wherein the amount of sodium sulfate in the mixture is at least about 30 mole %.

10. A microetchant and cleaning solution for copper clad substrates in the production of printed wiring boards, said solution comprising, dissolved in an aqueous medium in concentrations effective for microetching and cleaning action, (a) an alkali metal persulfate, (b) a metal salt component selected from the group consisting of alkali metal sulfates and mixtures of alkali metal sulfates and alkali metal bisulfates, and (d) sulfuric acid, wherein the a:b:d mole ratio is in the range of 1:0.3:0.2 to 1:10:3 and the amount of alkali metal sulfate in the mixture of (b) is at least 10 mole %.

11. The solution of claim 10 wherein the concentrations of (a), (b) and (d) are in the ranges 0.1–2.0M, 0.3–4.0M and 0.2–1.0M, respectively.

12. The solution of claim 10 wherein the concentrations of (a), (b) and (d) are in the ranges 0.25–1.0M, 0.3–2.0M and 0.2–0.4M, respectively.

13. The solution of claim 10 additionally comprising component (c) a water soluble component different from metal salt component (b), said component (c) selected from the group consisting of metal sulfates, metal bisulfates and mixtures thereof, wherein the mole ratio of (a) to (c) is in the range of 1:0.001 to 1:1.

14. The solution of claim 13 wherein the metal salt (c) is copper sulfate or a hydrate thereof.

15. The solution of any one of claims 10–13 wherein the alkali metal of components (a) and (b) is sodium, potassium or a combination thereof.

16. The solution of any one of claims 10–13 wherein the alkali metal of components (a) and (b) is sodium.

17. A method of preparing a solution for microetching and cleaning copper clad substrates in the production of printed wiring boards, said method comprising forming an aqueous solution of the dry mixture of claim 1, said solution comprising (a) an alkali metal persulfate and (b) a metal salt component selected from the group consisting of alkali metal sulfates and mixtures of alkali metal sulfates and alkali metal bisulfates, and (d) sulfuric acid, to provide concentration of (a), (b) and (d) in the ranges of 0.1–2.0M, 0.3–4.0 and 0.2–1.0M, respectively.

18. The method of claim 17 wherein a water soluble component is additionally dissolved in the aqueous medium said water soluble component (c) different from metal salt component (b), said component selected from the group consisting of metal sulfates, metal bisulfates and mixtures thereof, to provide a concentration in the range of 0.001 to 0.3M.

19. The method of claim 18 wherein the metal salt (c) is copper sulfate or a hydrate thereof.

20. A microetchant and cleaning solution for copper clad substrates in the production of printed wiring boards, said solution consisting essentially of, dissolved in an aqueous medium in concentrations effective for microetching and cleaning action:
  (a) an alkali metal persulfate:
  (b) a metal salt component selected from the group consisting of alkali metal sulfates and mixtures of alkali metal sulfates and alkali metal bisulfates, said mixtures containing at least 10 mole % alkali metal sulfate;
  optionally a water soluble metal salt different from metal salt component (b), said component (c) selected from the group consisting of metal sulfates, metal bisulfates, and mixtures thereof, wherein the mole ratio of (a) to (c) is in the range of 1.0:0.001 to 1:1;
  (d) sulfuric acid; and
  optionally a surfactant (e) in an amount effective to improve wettability of the solution on the copper clad substrate;
  wherein the a:b:d mole ratio is in the range of 1:0.3:0.2 to 1:10:3.

21. The solution of any one of claims 10–14 additionally containing a surfactant (e) in an amount effective to improve wettability of the solution on the copper clad substrates.

22. The solution of claim 21 wherein the surfactant (e) is a fatty alcohol ethoxylate derived from tridecyl alcohol.

23. The method of anyone of claims 17–19 wherein a surfactant (e) is added to the solution in an amount effective to improve wettability of the solution on the copper clad substrates.

24. The method of claim 23 wherein the surfactant (e) is a fatty alcohol ethoxylate derived from tridecyl alcohol.

25. The solution of claim 10 wherein the metal salt component (b) comprises at least 50 mole % alkali metal sulfate.

26. The solution of claim 10 wherein the metal salt component (b) is an alkali metal sulfate.

27. The solution of claim 12 wherein the metal salt component (b) comprises at least 50 mole % alkali metal sulfate.

28. The solution of claim 12 wherein the metal salt component (b) is an alkali metal sulfate.

29. The composition of claim 1 wherein the metal salt component (b) comprises at least 50 mole % alkali metal sulfate.

30. The composition of claim 1 wherein the metal salt component (b) is an alkali metal sulfate.

31. The composition of claim 3 wherein the metal salt component (b) comprises at least 50 mole % alkali metal sulfate.

32. The composition of claim 3 wherein the metal salt component (b) is an alkali metal sulfate.

33. The solution of claim 26 additionally comprising a surfactant (e) in an amount effective to improve wettability of the solution of the copper clad substrate.

34. The solution of claim 33 wherein the surfactant (e) is a fatty alcohol ethoxylate derived from tridecyl alcohol.

35. A method of microetching and cleaning a copper clad substrate used in the production of printed wiring boards, the method comprising
  contacting the substrate with the solution of any one of claims 10–14, 25–28, and 33–34, and
  removing the solution together with undesired residues.

36. The solution of claim 20 wherein the concentrations of (a), (b) and (d) are in the ranges 0.1–2.0M, 0.3–4.0M and 0.2–1.0M, respectively.

37. The solution of claim 36 wherein the metal salt (c) is copper sulfate or a hydrate thereof.

38. A method of microetching and cleaning copper clad substrates used in the production of printed wiring boards, the method comprising:
  contacting a copper clad substrate with the solution of claim 20; and
  removing the solution along with any undesired residues.

39. The method of claim 38 wherein the concentrations of (a), (b) and (d) are in the ranges 0.1–2.0M, 0.3–4.0M and 0.2–1.0M, respectively.

40. The method of claim 39 wherein the metal salt (c) is copper sulfate or a hydrate thereof.

* * * * *